(12) United States Patent
Chu et al.

(10) Patent No.: US 10,748,820 B2
(45) Date of Patent: Aug. 18, 2020

(54) SOURCE/DRAIN FEATURES WITH AN ETCH STOP LAYER

(71) Applicant: Taiwan Semiconductor Manufacturing Co., Ltd., Hsinchu (TW)

(72) Inventors: Feng-Ching Chu, Hsinchu (TW); Wei-Yang Lee, Taipei (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/717,426

(22) Filed: Dec. 17, 2019

(65) Prior Publication Data

US 2020/0126869 A1 Apr. 23, 2020

Related U.S. Application Data

(60) Continuation of application No. 16/449,510, filed on Jun. 24, 2019, now Pat. No. 10,522,420, which is a
(Continued)

(51) Int. Cl.
*H01L 21/02* (2006.01)
*H01L 21/8238* (2006.01)
(Continued)

(52) U.S. Cl.
CPC .. *H01L 21/823821* (2013.01); *H01L 21/0257* (2013.01); *H01L 21/0262* (2013.01); *H01L 21/02532* (2013.01); *H01L 21/26506* (2013.01); *H01L 21/823814* (2013.01); *H01L 21/823828* (2013.01); *H01L 27/0924* (2013.01); *H01L 29/167* (2013.01); *H01L 29/66545* (2013.01); *H01L 21/0274* (2013.01);
(Continued)

(58) Field of Classification Search
CPC ........... H01L 29/66795; H01L 29/7851; H01L 29/66545; H01L 21/3065; H01L 21/823431; H01L 21/823821
See application file for complete search history.

(56) References Cited

U.S. PATENT DOCUMENTS 8,772,109 B2  7/2014  Colinge
8,785,285 B2  7/2014  Tsai et al.
(Continued)

*Primary Examiner* — Jaehwan Oh
(74) *Attorney, Agent, or Firm* — Haynes and Boone, LLP

(57) ABSTRACT

The present disclosure provides a semiconductor device. The semiconductor device includes a substrate having a first device region and a second device region, a first fin over the substrate in the first device region, a second fin over the substrate in the second device region, a first epitaxial feature over the first fin in the source/drain region of the first fin, a second epitaxial feature over the second fin in the source/drain region of the second fin, and a dielectric layer on the first and second epitaxial features. The first epitaxial feature is doped with a first dopant of a first conductivity and the second epitaxial feature is doped with a second dopant of a second conductivity different from the first conductivity. The dielectric layer is doped with the first dopant.

20 Claims, 17 Drawing Sheets

US 10,748,820 B2

Page 2

Related U.S. Application Data division of application No. 15/806,603, filed on Nov. 8, 2017, now Pat. No. 10,403,551.

(51) Int. Cl.

| | |
|---|---|
| *H01L 29/66* | (2006.01) |
| *H01L 29/167* | (2006.01) |
| *H01L 27/092* | (2006.01) |
| *H01L 21/265* | (2006.01) |
| *H01L 29/78* | (2006.01) |
| *H01L 29/165* | (2006.01) |
| *H01L 29/08* | (2006.01) |
| *H01L 21/762* | (2006.01) |
| *H01L 21/3115* | (2006.01) |
| *H01L 21/308* | (2006.01) |
| *H01L 21/027* | (2006.01) |

(52) U.S. Cl.
CPC ..... *H01L 21/3086* (2013.01); *H01L 21/31155* (2013.01); *H01L 21/76224* (2013.01); *H01L 21/76229* (2013.01); *H01L 21/823878* (2013.01); *H01L 29/0847* (2013.01); *H01L 29/165* (2013.01); *H01L 29/7848* (2013.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,847,293 B2 | 9/2014 | Lee et al. | |
| 8,860,148 B2 | 10/2014 | Hu et al. | |
| 8,962,400 B2 | 2/2015 | Tsai et al. | |
| 8,994,104 B2* | 3/2015 | Glass | H01L 29/36 257/335 |
| 9,000,536 B2* | 4/2015 | Kuo | H01L 29/66803 257/328 |
| 9,054,189 B1* | 6/2015 | Kim | H01L 29/7848 |
| 9,105,490 B2 | 8/2015 | Wang et al. | |
| 9,153,692 B2* | 10/2015 | Kim | H01L 29/785 |
| 9,171,925 B2 | 10/2015 | Kuo | H01L 29/66545 |
| 9,202,918 B2* | 12/2015 | Xie | H01L 29/785 |
| 9,236,267 B2 | 1/2016 | De et al. | |
| 9,236,300 B2 | 1/2016 | Liaw | |
| 9,349,837 B2* | 5/2016 | Ching | H01L 29/66795 |
| 9,391,200 B2* | 7/2016 | Liu | H01L 29/7848 |
| 9,419,106 B2* | 8/2016 | Joshi | H01L 29/785 |
| 9,443,769 B2* | 9/2016 | Wang | H01L 29/41783 |
| 9,443,962 B2* | 9/2016 | Ching | H01L 29/66795 |
| 9,466,669 B2* | 10/2016 | Rodder | H01L 21/823418 |
| 9,520,482 B1 | 12/2016 | Chang et al. | |
| 9,576,814 B2 | 2/2017 | Wu et al. | |
| 9,831,345 B2* | 11/2017 | Yu | H01L 29/66795 |
| 9,847,224 B2* | 12/2017 | Kim | H01L 21/823878 |
| 9,905,676 B2* | 2/2018 | Kim | H01L 29/66795 |
| 10,157,919 B2* | 12/2018 | Zeng | H01L 21/823807 |
| 2011/0140230 A1* | 6/2011 | Daval | H01L 21/30604 257/506 |
| 2011/0227162 A1* | 9/2011 | Lin | H01L 29/66795 257/368 |
| 2012/0319211 A1* | 12/2012 | van Dal | H01L 29/66795 257/401 |
| 2013/0056827 A1* | 3/2013 | Tsai | H01L 29/785 257/347 |
| 2014/0225065 A1* | 8/2014 | Rachmady | H01L 29/775 257/24 |
| 2014/0264440 A1* | 9/2014 | Chen | H01L 29/66636 257/190 |
| 2016/0056262 A1* | 2/2016 | Ho | H01L 29/66545 257/288 |
| 2017/0250278 A1* | 8/2017 | Tsai | H01L 29/7833 |
| 2019/0139836 A1 | 5/2019 | Chu et al. | |

* cited by examiner

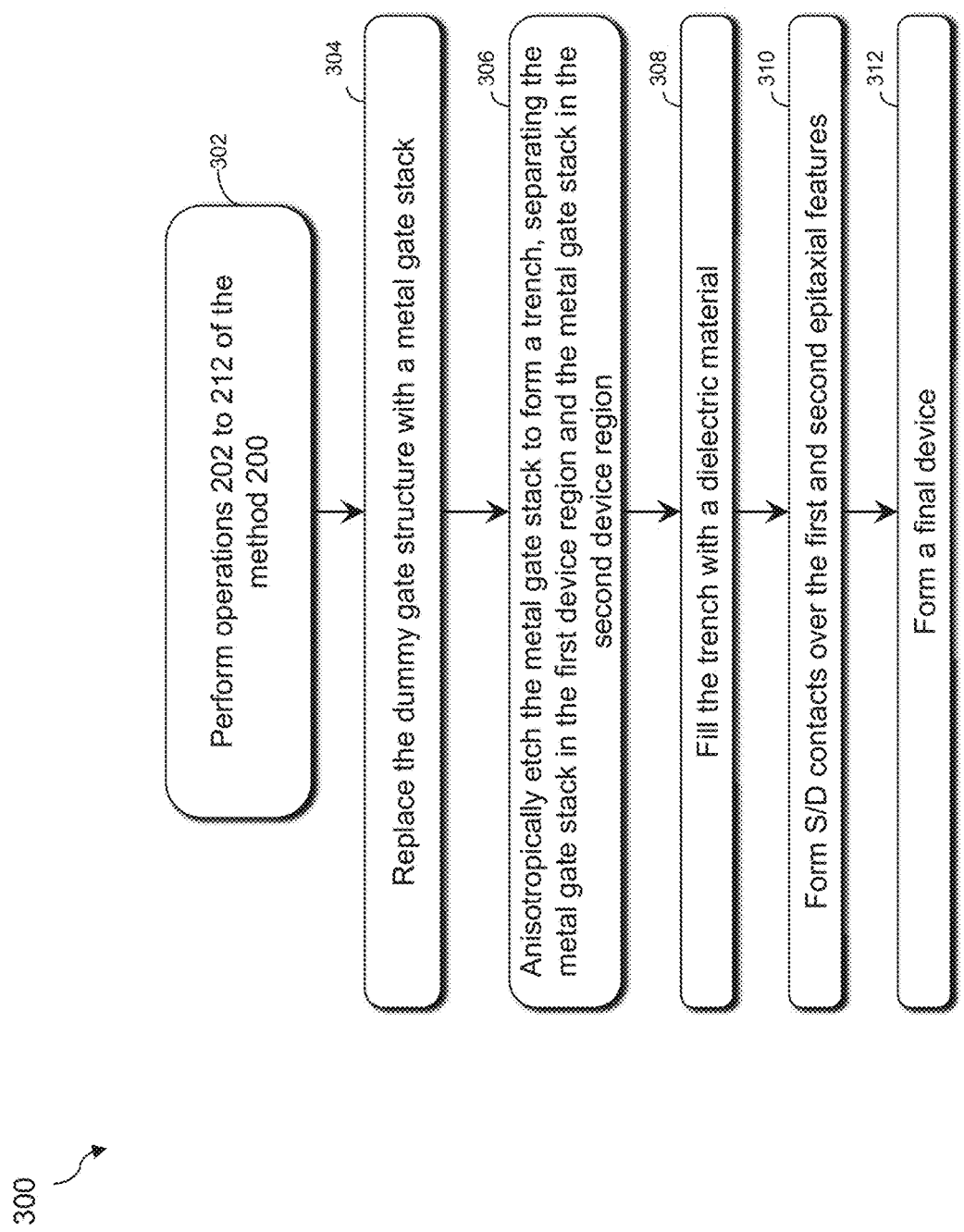

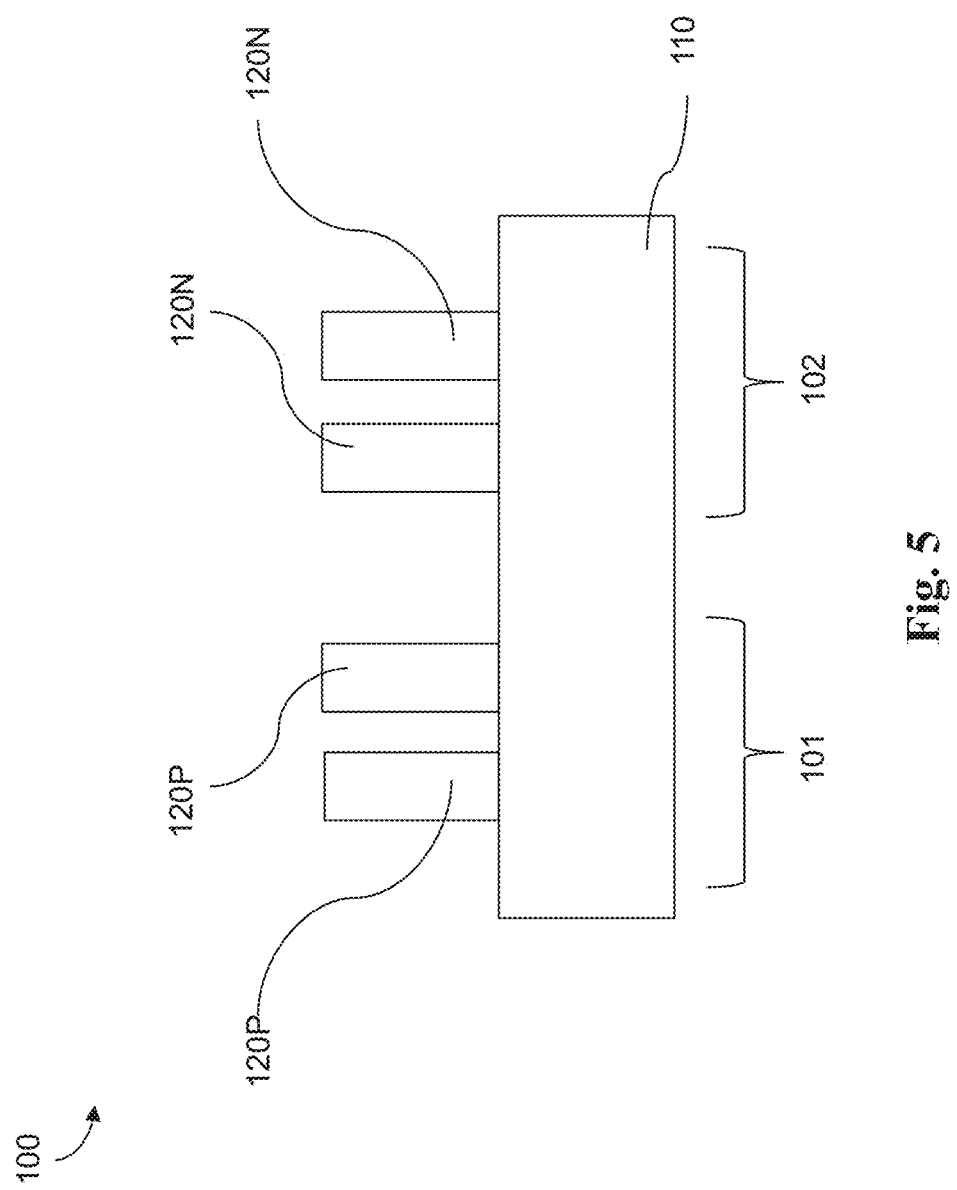

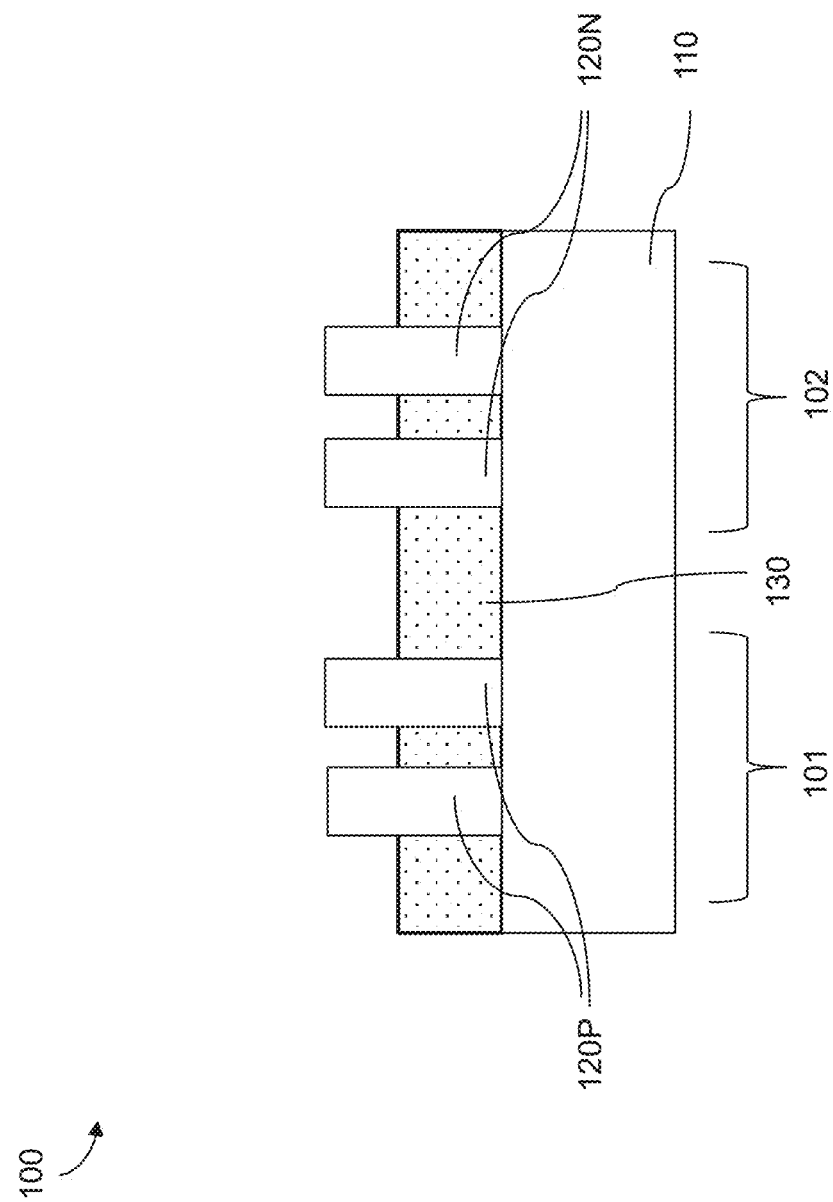

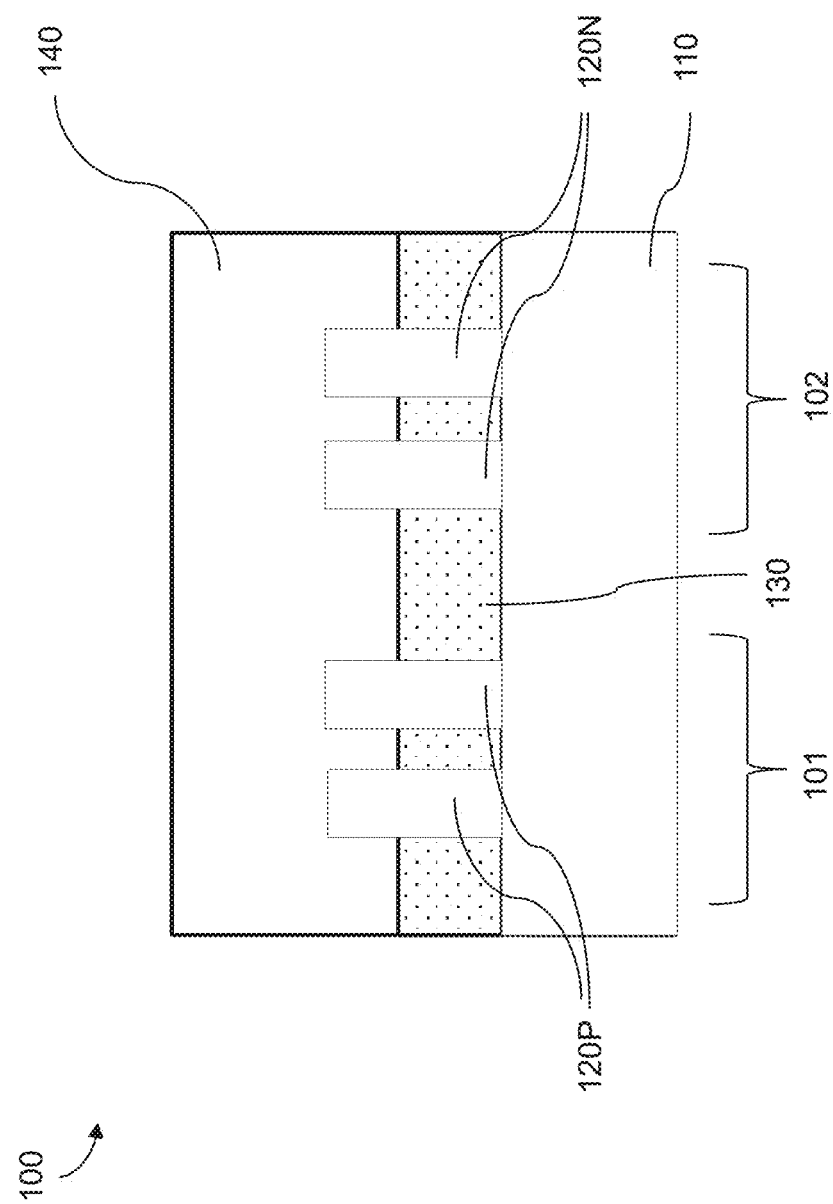

SOURCE/DRAIN FEATURES WITH AN ETCH STOP LAYER

PRIORITY DATA

The present application is a continuation application of U.S. application Ser. No. 16/449,510, filed Jun. 24, 2019, which is a divisional application of U.S. application Ser. No. 15/806,603, filed Nov. 8, 2017, each of which is incorporated herein by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" extending from a substrate formed by, for example, etching away a portion of a silicon layer of the substrate or epitaxial layers grown on the substrate. The channel of the FinFET is formed in this vertical fin. A gate is provided over (e.g., wrapping around) the fin.

Fabricating a FinFET is not without its own challenges. For example, it is desirable to decrease the distance between a fin in an n-type field effect transistor (nFET) region and a fin in a p-type FET (pFET) region to increase device density. However, when the distance is decreased to a certain level, it becomes difficult to make a clean gate cut to separate dummy gate over a fin in the pFET region and a fin in the nFET region without damaging the epitaxial source/drain features. In some severe cases, epitaxial source/drain features can be substantially etched away in the course of a gate cut, causing device failures.

Therefore, although existing FinFET devices have been generally adequate for their intended purposes, they have not been satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 4 is a flowchart illustrating another method of fabricating a semiconductor device, according to some embodiments of the present disclosure.

FIGS. 5-16 are cross-sectional views of a semiconductor device at various stages of the methods illustrated in FIGS. 3A, 3B, and 4, according to various embodiments of the present disclosure.

DESCRIPTION

Figure 1:
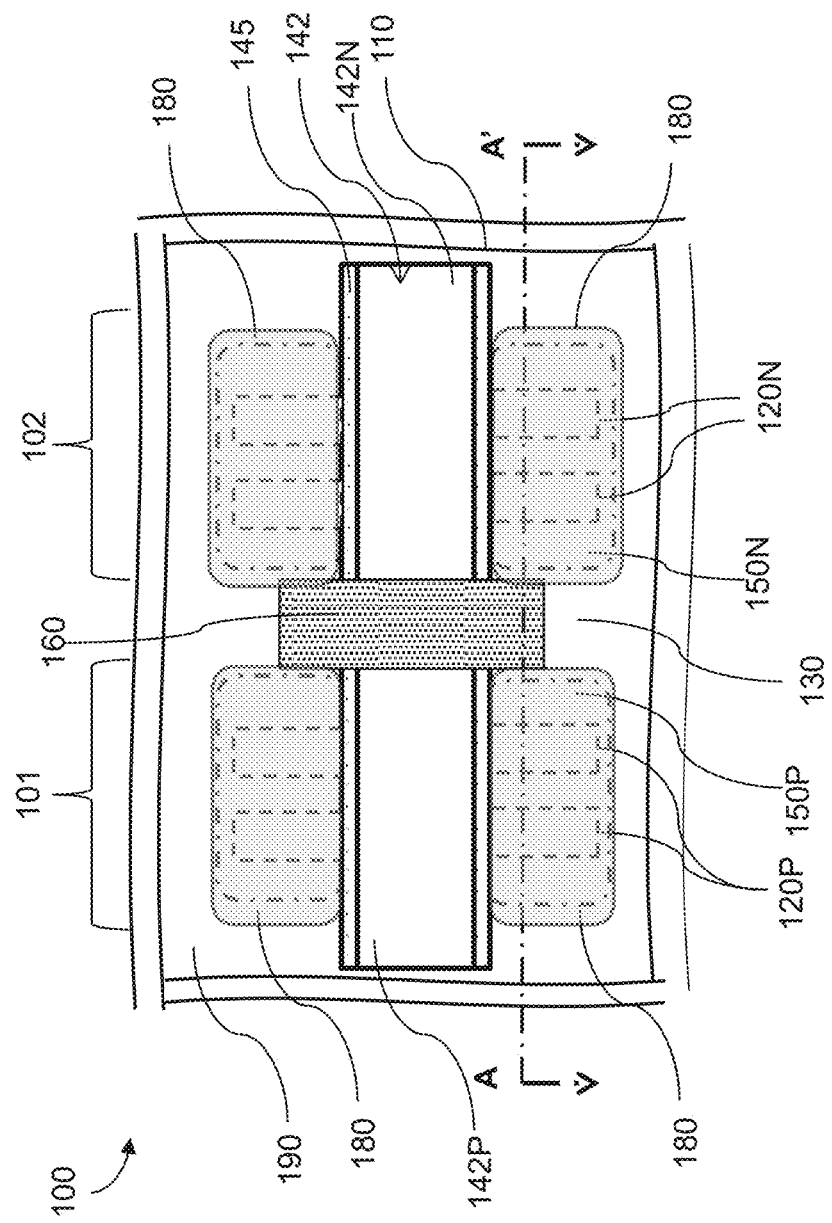
FIG. 1 is a schematic top view of a semiconductor device according to various embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure is generally related to semiconductor devices and methods of fabricating the same. More particularly, some embodiments are directed to, but not otherwise limited to, a fin-like field-effect transistor (FinFET) structure. The FinFET structure, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

Figure 2:
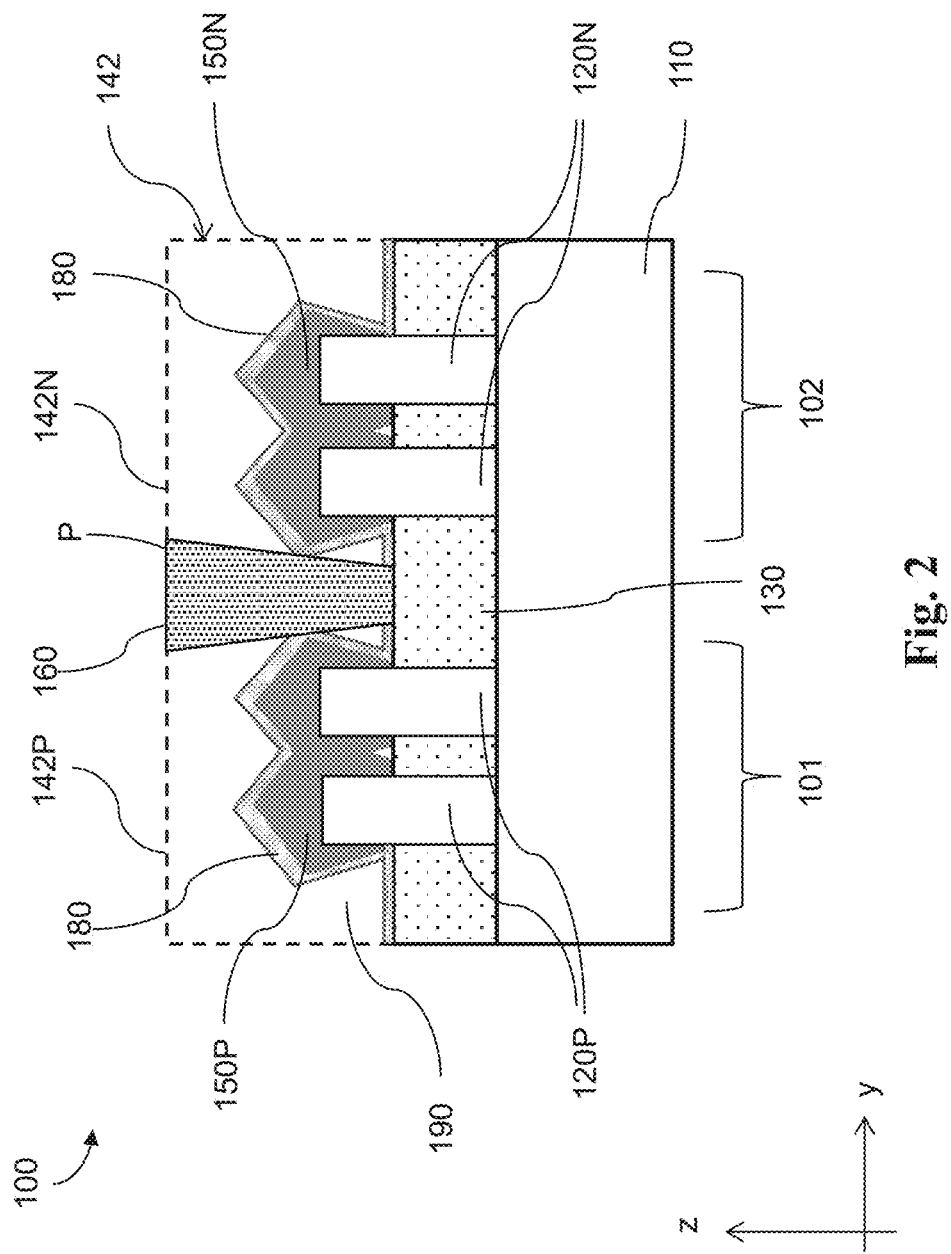
FIG. 2 is a schematic cross-sectional view of the semiconductor device along a plane defined by section AA' in FIG. 1, according to various embodiments of the present disclosure.

A suitable semiconductor device 100 is described with reference to FIGS. 1 and 2. In that regard, FIG. 1 is a schematic top view of a semiconductor device 100 according to various embodiments of the present disclosure, and FIG. 2 is a cross-sectional view of the semiconductor device 100 according to various embodiments. The semiconductor device 100 includes a substrate 110 upon which other features are formed. In various examples, the substrate 110 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof. The substrate 110 may be uniform in composition or may include various layers. The layers may have similar or different compositions, and in various embodiments, some substrate layers have non-uniform compositions to induce device strain and thereby tune device performance. Examples of layered substrates include silicon-on-insulator (SOI) substrates 110. In some such examples, a layer of the substrate 110 may include an insulator such as a semiconductor oxide, a semiconductor nitride, a semiconductor oxynitride, a semiconductor carbide, and/or other suitable insulator materials.

Fins (e.g., fin 120P and/or Fin 120N) extend from the substrate. The fins may be formed by etching away substrate material, epitaxially growing material on the substrate 110, or combinations thereof. In some embodiments, fins 120P and 120N are formed by epitaxially growing semiconductor material (e.g., Si, Ge, SiGe, etc.) on the substrate 110 Introduction of Ge or C into Si lattice can strain the Si lattice and is utilized to improve the device performance in certain aspects. In some embodiments, the epitaxial layers are formed of epitaxial growth of Si and Ge using techniques such as epitaxial deposition by chemical vapor deposition (CVD) or low-pressure chemical vapor deposition (LP-CVD). By controlling the delivery of gas reactants and other process parameters during the CVD epitaxial deposition, the concentrations of Si and Ge along the height of the epitaxial layers can be modulated. In embodiments where the fin 120 is formed of epitaxial layers, the epitaxial layers are first formed over the substrate 110 and then patterned as described further below. Further, in some implementations, the epitaxial layers on the substrate 110 can also be doped to include p-type dopants such as B, Al, Ga or n-type dopants such as Sb, As, and P. In those implementations, the resulting fins 120P or 120N, as the case may be, are doped accordingly.

In some embodiments, the fin 120P/N is formed from the epitaxial layers by photolithography patterning and etching. For example, a patterned photoresist layer is formed on the epitaxial layers by a photolithography technique, and then an etching process, such as anisotropic etching, is applied to the epitaxial layers to form one or more fins 120P/N. In another example, a hard mask is used. In that case, the hard mask is formed by depositing a hard mask material on the epitaxial SiGe layer. A photoresist layer is then deposited on the hard mask. After patterned using photolithography, the photoresist on the hard mask then serves as the etch mask when the hard mask is etched and patterned. Thereafter, an etching process, such as anisotropic etching, is applied to the epitaxial layers to form one or more fins 120P/N using the hard mask as an etch mask.

To isolate a fin 120P/N from an adjacent fin, a dielectric material (such as thermally grown silicon oxide and CVD deposited silicon oxide) is deposited to fill trenches between the fin 120P/N and its neighboring fins. The dielectric layer is then polished by chemical mechanical polishing (CMP) and then etched back to expose a portion of the fin 120P/N while a portion of the fin 120P/N remains covered by the etched back dielectric layer. The dielectric layer between neighboring fins may be referred to as shallow trench isolation (STI). For example, the fins 120P in the first device region 101 are isolated from the fins 120N in the second device region 102 by an STI 130.

The semiconductor device 100 includes a gate stack 142 (or metal gate stack 142) over a channel region of the fins 120P and 120N. It is noted that the gate stack 142 does not exist on the plan AA'. However, for illustration purposes, the projection of the gate stack 142 on the plan AA' is shown in dotted lines. In some embodiments represented by FIGS. 1 and 2, the gate stack 142 is separated by a gate insulation feature 160 into a gate segment 142P and 142N. In some examples, the formation of the metal gate stack 142 includes depositing a dummy gate layer containing polysilicon (poly-Si) or other suitable material and patterning the dummy gate layer. A gate hard mask layer may be formed on the dummy gate material layer and is used as an etch mask during the formation of a dummy gate. The gate hard mask layer may include any suitable material, such as a silicon oxide ($SiO_2$), a silicon nitride (SiN), a silicon carbide (SiC), a silicon oxynitride (SiON), other suitable materials, and/or combinations thereof. In some embodiments, the patterning process to form the dummy gate includes forming a patterned resist layer by lithography process; etching the hard mask layer using the patterned resist layer as an etch mask; and etching the gate material layer to form the dummy gate using the patterned hard mask layer as an etch mask. A gate replacement process follows to replace the dummy gate with the gate stack 142. The gate stack 142 at least includes a gate dielectric layer interfacing the fins 120P/N and a metal layer over the gate dielectric layer. The gate dielectric layer can be formed of high-K dielectrics such as hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN (Pb-$Mg_xNb_{1-x}O_3$), PZT ($PbZr_xTi_{1-x}O_3$), PZN ($PbZn_xNb_{1-x}O_3$), and PST ($PbSc_xTa_{1-x}O_3$), lead lanthanum titanate, strontium bismuth tantalate, bismuth titanate and barium zirconium titanate. The gate stack 142 may include one or more work function metal layers formed of, for example, TiN, TaN, TaCN, TiCN, TiC, Mo, and W. The semiconductor device 100 can also include a gate spacer 145 on sidewalls of the gate stack 142.

The semiconductor device 100 further includes epitaxial features 150P and 150N over the fin 120P and 120N in the source/drain regions on either side of the gate stack 142 in the channel regions, with the epitaxial feature 150P in the first device region 101 and the epitaxial feature 150N in the second device region 102. In some embodiments, the source/drain features 150P and 150N are formed by one or more epitaxy or epitaxial (epi) processes, whereby Si features, SiGe features, and/or other suitable features are grown in a crystalline state on the fins 120P and 120N in the source/drain regions. Alternatively, an etching process is applied to recess the source/drain regions of the fins 120P and 120N before the epitaxy growth. Suitable epitaxy processes include CVD deposition techniques (e.g., vapor-phase epitaxy (VPE) and/or ultra-high vacuum CVD (UHV-CVD), molecular beam epitaxy, and/or other suitable processes.

The source/drain features 150P and 150N may be in-situ doped during the epitaxy process by introducing doping species including: p-type dopants, such as boron or BF2; n-type dopants, such as phosphorus or arsenic; and/or other suitable dopants including combinations thereof. If the source/drain features 150P and 150N are not in-situ doped, an implantation process (i.e., a junction implant process) is performed to introduce the corresponding dopant into the source/drain features 150P and 150N. In an exemplary embodiment, the source/drain feature 150P in the first device region includes SiGeB, while the source/drain feature 150N in the second device region includes SiP. One or more annealing processes may be performed thereafter to activate the source/drain features 150P and 150N. Suitable annealing processes include rapid thermal annealing (RTA), laser annealing processes, other suitable annealing technique or a combination thereof.

In the embodiments represented by FIG. 1, the semiconductor device 100 includes a dielectric layer 180 formed over the epitaxial features 150P and 150N to protect them from being damaged in later processes. In some embodiments, the dielectric layer 180 is also formed over the STI 130. This dielectric layer 180 can sometimes be referred to as a contact etch stop layer (CESL) 180, as shown in FIG. 1. The CESL 180 may be formed of a material that has different etching selectivity from that of the gate stack 142 and the dummy gate to be replaced by the gate stack 142. In some embodiments, the CESL 180 can be formed of silicon nitride (SiN) or other suitable materials. In some embodiments of the present disclosure, the CESL 180 is doped with a dopant. In some implementations, the CESL 180 that is formed over both the epitaxial features 150P and 150N is doped with a p-type dopant. In one such instance, the CESL 180 is doped with boron. Accordingly, in one embodiment, a CESL 180 containing SiN and boron (a p-type dopant) is formed on an epitaxial feature 150N containing silicon and phosphorous (an n-type dopant).

The semiconductor device 100 also includes an interlayer dielectric (ILD) layer 190 deposited over the substrate 110. After the ILD 190 is deposited, a chemical mechanical polishing (CMP) process is performed to planarize the ILD 190.

The semiconductor device 100 further includes an gate isolation feature 160 that separates the gate stack 142 into the gate segment 142P within the first device region 101 and the gate segment 142N within the second device region 102. The gate isolation feature 160 can be formed of a dielectric material filled in a trench that electrically isolates adjacent gate stacks 142. The trench that tracks the shape and profile of the isolation feature is formed in a "gate cut" process, the purpose of which is to separate an otherwise contiguous metal gate structure into segments insulated from one another. The dielectric material in the gate isolation feature 160 can be silicon nitride or other suitable materials that provide insulation and do not contaminate the gate stack 142.

The gate isolation feature 160 extends along the "z" direction through the height of the gate stack 142 to insulate the gate segment 142P in the first device region 101 and the gate segment 142N in the second device region 102. In some instances, the gate isolation feature 160 does not stop at the top surface of the STI 130 as shown in FIG. 2, but extends into the STI 130. As the semiconductor device 100 is getting increasingly smaller, a distance P between the epitaxial feature 150P and the epitaxial feature 150N is increasing smaller. Therefore, it becomes increasingly difficult to make a clean gate cut without damaging the epitaxial features 150P and 150N. FIG. 2 represents instances where the distance P is small and the gate isolation feature 160 is in contact with the CESL 180. One of the advantages provided by some embodiments of the present disclosure is that the boron-doped CESL 180 retards the etching used in the gate cut process and prevents the epitaxial features 150N and 150P from being damaged. Without the boron-doped CESL 180, the gate cut process can etch away a substantial amount of the epitaxial feature 150N or 150P, leaving a void behind. The damaged epitaxial features 150P and 150N can cripple normal functions of the semiconductor device 100, causing failures and reducing production yield. This epitaxial feature damage may be more prevalent with respect to epitaxial features of one conductivity type (e.g., feature 150N) than the other because different dopants in the epitaxial features may affect their sensitivity to etchants. In some other embodiments, the CESL may be undoped.

Figure 3A:
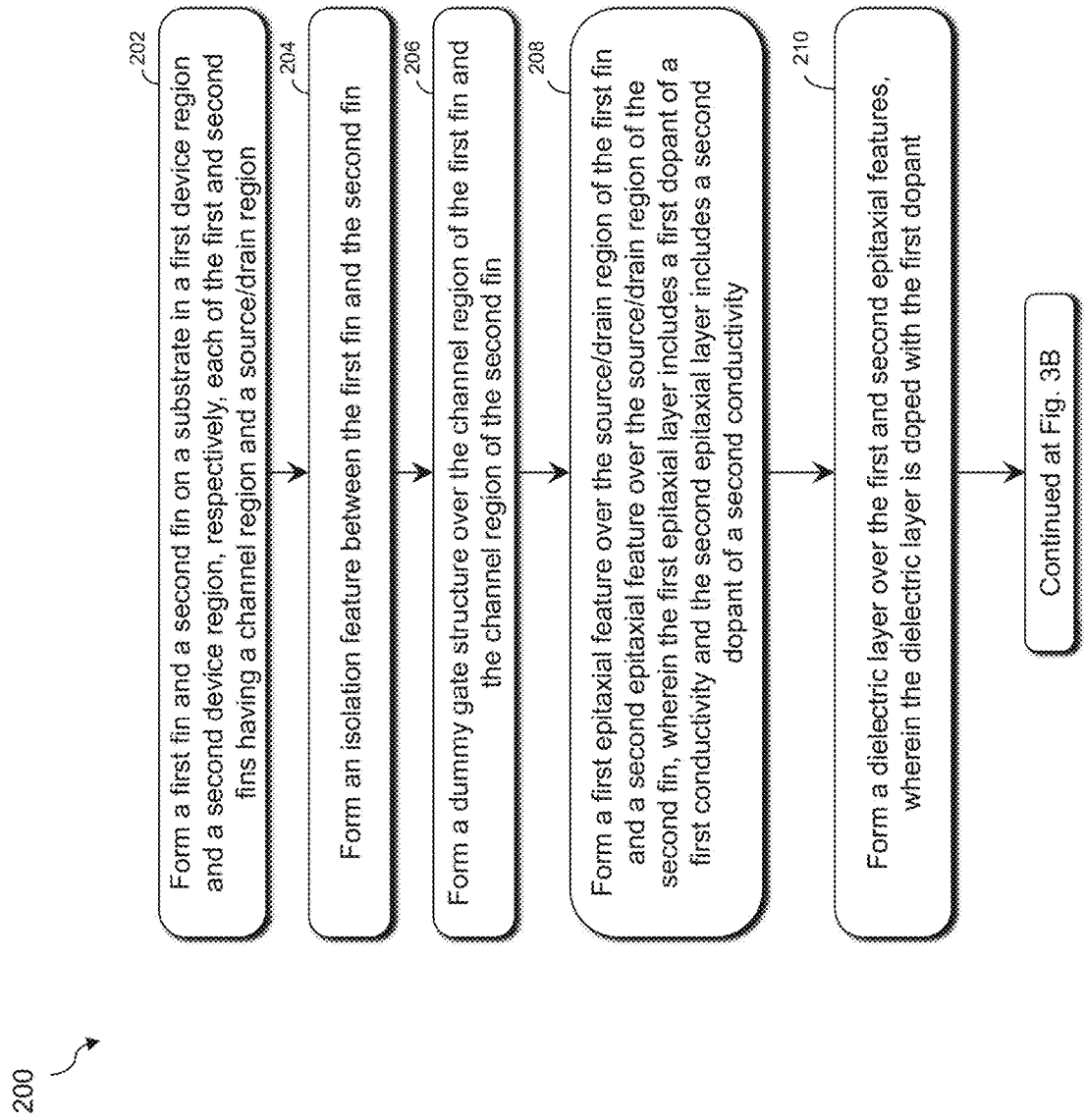
FIGS. 3A and 3B depict a flowchart illustrating a method of fabricating a semiconductor device, according to some embodiments of the present disclosure.
Figure 3B:
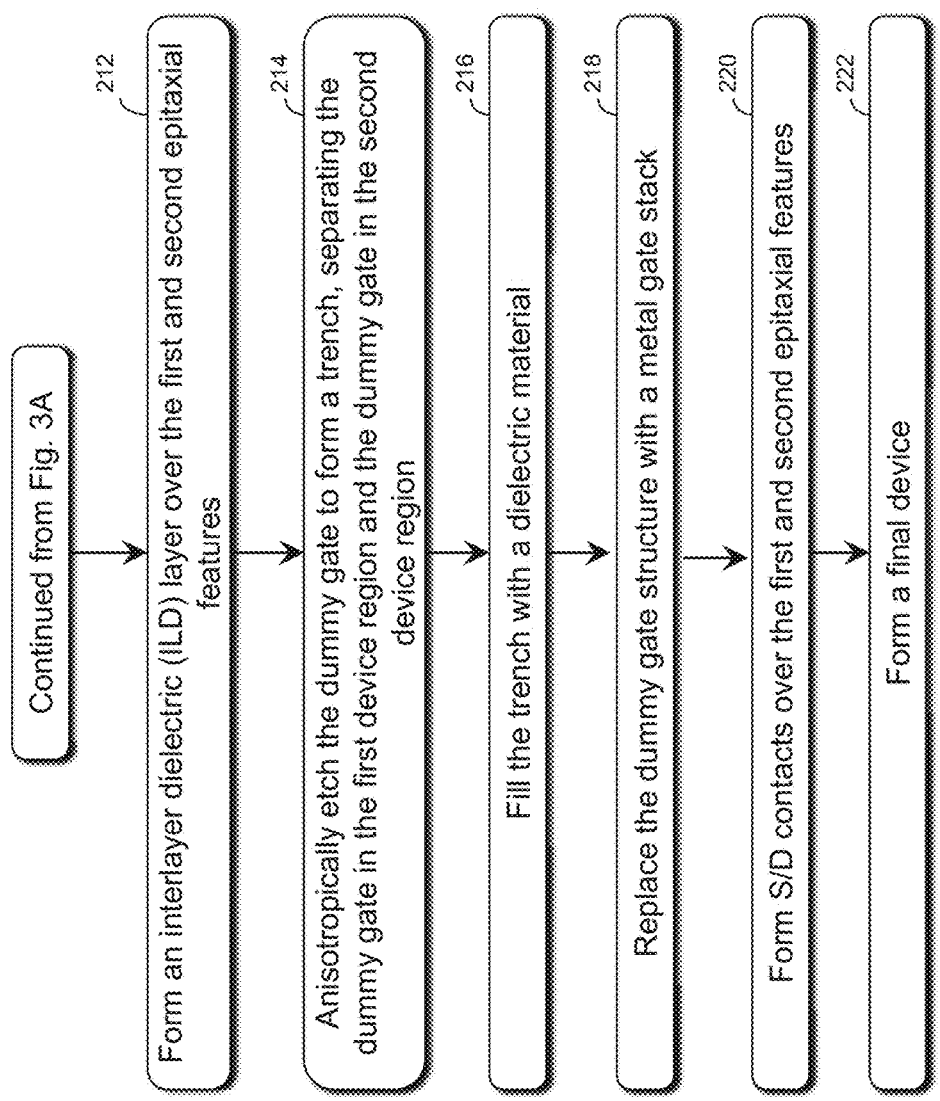

Shown in FIGS. 3A and 3B is a flowchart illustrating a method 200 for forming the semiconductor device 100. Operations in the method 200 are described in further details with references to FIGS. 5-13, which show cross-sectional views of the semiconductor device 100 along section A-A'. Additional operations can be provided before, during, and after the method 200, and some operations described can be replaced, eliminated, or performed in alternative orders for additional embodiments of the method.

Referring to operation 202 of FIG. 3A) and to FIG. 5, fins 120P are formed on a substrate 110 in a first device region 101 and fins 120N are formed on the substrate 110 in a second device region 102. In some instances, the first device region 101 is a pFET region and the second device region 102 is an nFET region.

The fin 120P/N may be formed from the epitaxial layers by photolithography patterning and etching. For example, a patterned photoresist layer is formed on the epitaxial layers by a photolithography technique, and then an etching process, such as anisotropic etching, is applied to the epitaxial layers to form one or more fins 120P/N. In another example, a hard mask is used. In that case, the hard mask is formed by depositing a hard mask material on the epitaxial layer. A photoresist layer is then deposited on the hard mask. After patterned using photolithography, the photoresist on the hard mask then serves as the etch mask when the hard mask is etched and patterned. Thereafter, an etching process, such as anisotropic etching, is applied to the epitaxial layers to form one or more fin 120P/N using the hard mask as an etch mask.

Each of the fins 120P and 120N includes a channel region and source/drain regions on either side of the channel region. The top view of the semiconductor device 100 in FIG. 1 illustrates the channel region and the source/drain regions. Taking the fins 120N in the second device region 102 for example, the channel regions of the fins 120N are covered by the gate stack 142 and the S/D regions of the fins 120N are located on either side of the gate stack 142.

Referring now to operation 204 of the method 200 (FIG. 3A) and FIG. 6, an isolation feature is formed between the fins 120P and the fins 120N. To isolate the fins 120P and 120N from an adjacent fin, a dielectric material (such as thermally grown silicon oxide and CVD deposited silicon oxide) is formed to fill trenches between the fins 120P and 120N and their neighboring fins. The dielectric layer is then polished by CMP and then etched back to expose a portion of the fins 120P and 120N while a portion of the fins 120P and 120N remains covered by the etched back dielectric layer, which may be referred to as the STI. In this case, the STI is STI 130.

Reference is now made to operation 206 of the method 200 (FIG. 3A) and FIG. 7, a dummy gate structure 140 (or dummy gate 140) is formed over the channel region of the fin 120P and the channel region of the fin 120N. It is noted that the dummy gate structure 140 does not exist on the plan AA'. However, for illustration purposes, the projection of the gate stack 142 on the plan AA' is depicted in FIG. 7. In some examples, the formation of the dummy gate structure 140 includes depositing a dummy gate layer containing polysilicon or other suitable material and patterning the dummy gate layer. A gate hard mask layer may be formed on the dummy gate material layer and is used as an etch mask during the formation of the dummy gate structure 140. The gate hard mask layer may include any suitable material, such as a silicon oxide, a silicon nitride, a silicon carbide, a silicon oxynitride, other suitable materials, and/or combinations thereof. In some embodiments, the patterning process to form the dummy gate structure 140 includes forming a patterned resist layer by lithography process; etching the hard mask layer using the patterned resist layer as an etch mask; and etching the gate material layer to form the dummy gate structure 140 using the patterned hard mask layer as an etch mask. In some embodiments, a gate spacer similar to the gate spacer 145 shown in FIG. 1 is formed over the sidewalls of the dummy gate structure 140.

Figure 8:
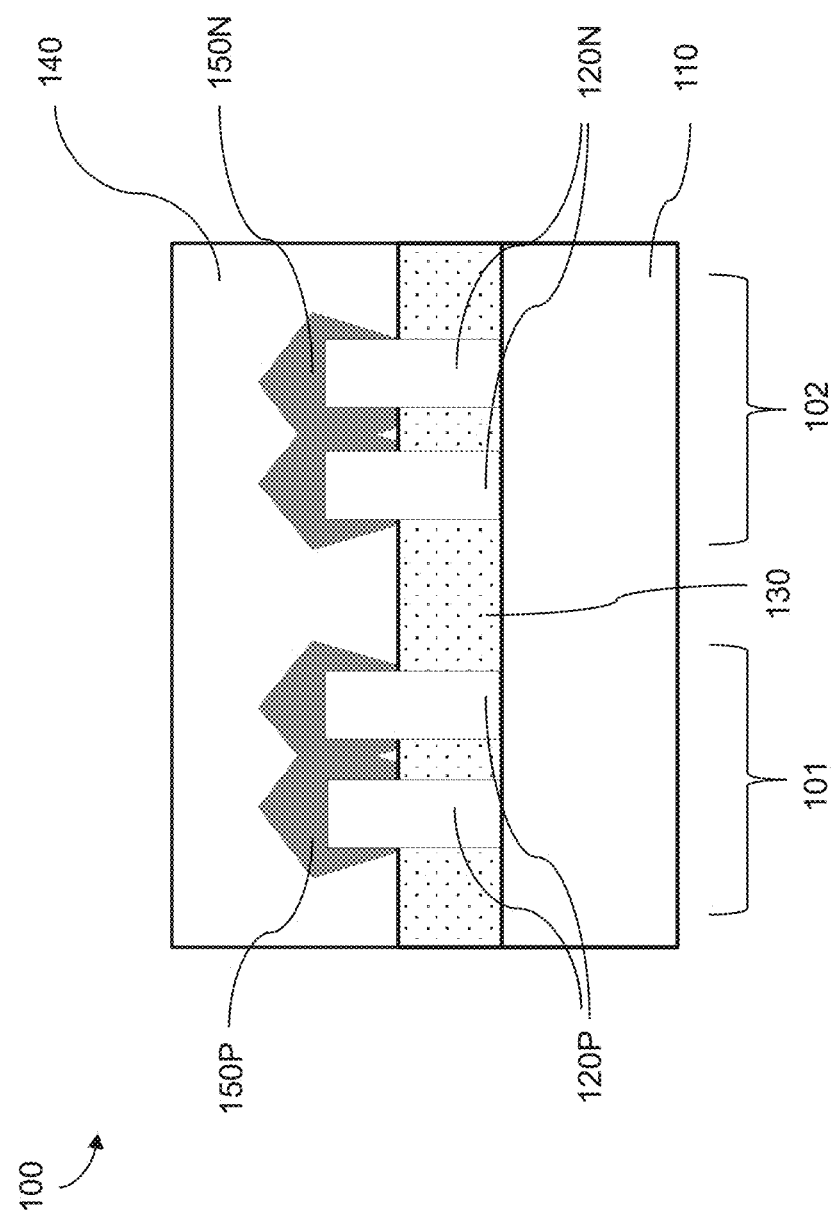

Reference is now made to operation 208 of the method 200 (FIG. 3A) and FIG. 8, the epitaxial feature 150P (or S/D feature 150P) is formed over the S/D region of the fin 120P and the epitaxial feature 150N (or S/D feature 150N) is formed over the S/D region of the fin 120N. In some embodiments, the S/D features 150P and 150N are formed by one or more epitaxy or epitaxial (epi) processes, whereby Si features, SiGe features, SiC features, and/or other suitable features are grown in a crystalline state on the fins 120P and 120N. Alternatively, an etching process is applied to recess the source/drain regions before the epitaxy growth. Suitable epitaxy processes include CVD deposition techniques (e.g., vapor-phase epitaxy (VPE) and/or ultra-high vacuum CVD (UHV-CVD), molecular beam epitaxy, and/or other suitable processes. The epitaxy process may use gaseous and/or liquid precursors, which interact with the composition of the fins 120N and 120P. In some embodiments, the epitaxial feature 150P is formed of epitaxially grown SiGe and the epitaxial feature 150N is formed of epitaxially grown Si.

The source/drain features 150P and 150N may be in-situ doped during the epitaxy process by introducing doping species including: p-type dopants, such as boron or BF2; n-type dopants, such as phosphorus or arsenic; and/or other suitable dopants including combinations thereof. If the source/drain features 150P and 150N are not in-situ doped, an implantation process (i.e., a junction implant process) is performed to introduce the corresponding dopant into the source/drain features 150P and 150N. In some implementations, the first device region is a pFET region and the epitaxial feature 150P is doped with p-type dopants, and the second device region is a nFET region and the epitaxial feature 150N is doped with an n-type dopant. In an exemplary embodiment, the source/drain feature 150P in the first device region is formed of SiGe doped with B, while the source/drain feature 150N in the second device region is formed of Si doped with P. One or more annealing processes may be performed thereafter to activate the source/drain features 150P and 150N. Suitable annealing processes include rapid thermal annealing (RTA), laser annealing processes, other suitable annealing technique or a combination thereof.

Figure 9:
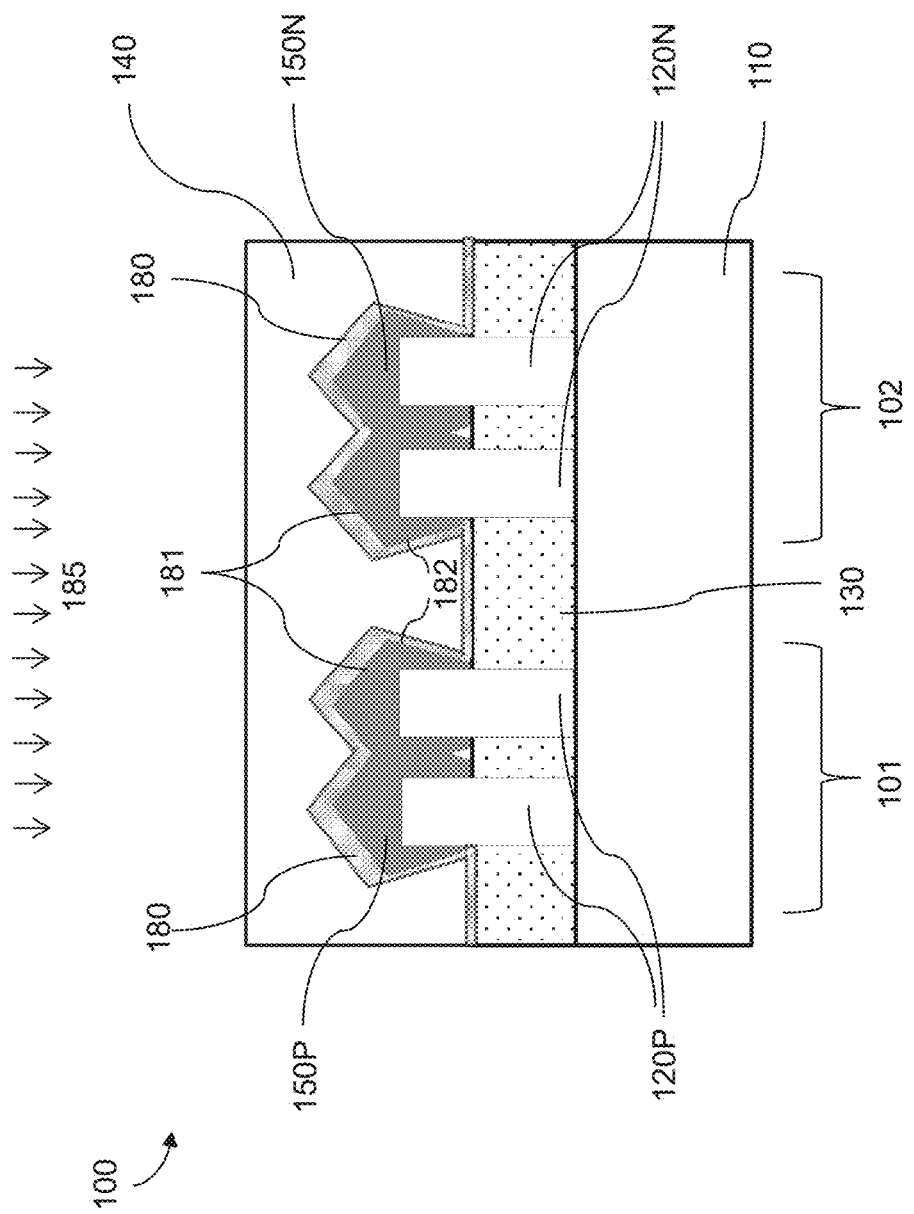

Referring now to operation 210 of the method 200 (FIG. 3A) and FIG. 9, a dielectric layer 180 is formed over the epitaxial feature 150P and the epitaxial feature 150N. In some embodiments as shown in FIG. 9, the dielectric layer 180 is also formed over the STI 130. The dielectric layer 180 is sometimes referred to as contact etch stop layer (CESL). In some embodiments, the dielectric layer 180 includes a dielectric material that possesses suitable etching selectivity for subsequent etching processes to etch polysilicon in the dummy gate 140 or metals in the gate stack 142. In addition, the dielectric material of the dielectric layer 180 may be conformal to the surface profile of the epitaxial features 150P and 150N. In some implementations, the dielectric material of the dielectric layer 180 includes silicon nitride (SiN), silicon oxynitride, or other suitable materials. In some examples, the dielectric layer 180 is deposited by atomic layer deposition (ALD) or CVD with proper precursor. In some embodiments, the dielectric layer 180 can have a thickness between 2 nm and 10 nm. In some implementations represented by FIG. 9, while the dielectric layer 180 is formed over the entire surface of the epitaxial feature 150P and the epitaxial feature 150N, the thickness of the dielectric layer 180 on the upward-facing surfaces 181 of the epitaxial features 150N and 150P can be smaller than the thickness of the dielectric layer 180 on the downward-facing surfaces 182 of the epitaxial features 150N and 150P.

In some embodiments, such as the example shown in FIG. 9, the dielectric layer 180 can be doped to further reduce etchant sensitivity. In some examples, the dielectric layer is doped with as boron (B) and gallium (Ga), by in situ doping and/or ion implantation. In the former case, a boron-containing gas, such as boron hydride ($BH_3$) or boron trichloride ($BCl_3$), is supplied into the process chamber to dope the dielectric layer 180 as it is formed. In cases where the p-type dopant is doped by implantation, the dielectric layer 180 without doping is first formed over the epitaxial features 150P and 150N in the first and second device regions 101 and 102 and the STI 130. Then the undoped dielectric layer 180 is subject to implantation of p-type dopant ions 185. In some implementations the p-type dopant in the CESL 180 includes a doping dose between 4E20 and 1E21 $cm^{-3}$. The p-type dopants in the operation 210 can be annealed in a separate operation for activation or can be annealed and activated in subsequent process. For instance, the p-type dopants can be annealed and activated after the formation of the ILD layer 190, Referring now to operation 212 of the method 200 (FIG. 3B) and FIG. 10, the ILD layer 190 is formed over the first and second epitaxial features 150N and 150P. In some embodiments, after the ILD 190 is deposited, a chemical mechanical polishing (CMP) process is performed to planarize the ILD 190 to provide a planar surface for subsequent processes. As the ILD 190 now blocks the view of the dummy gate structure 140, the dummy gate structure 140 is shown in dotted lines for illustration purposes.

Figure 11:
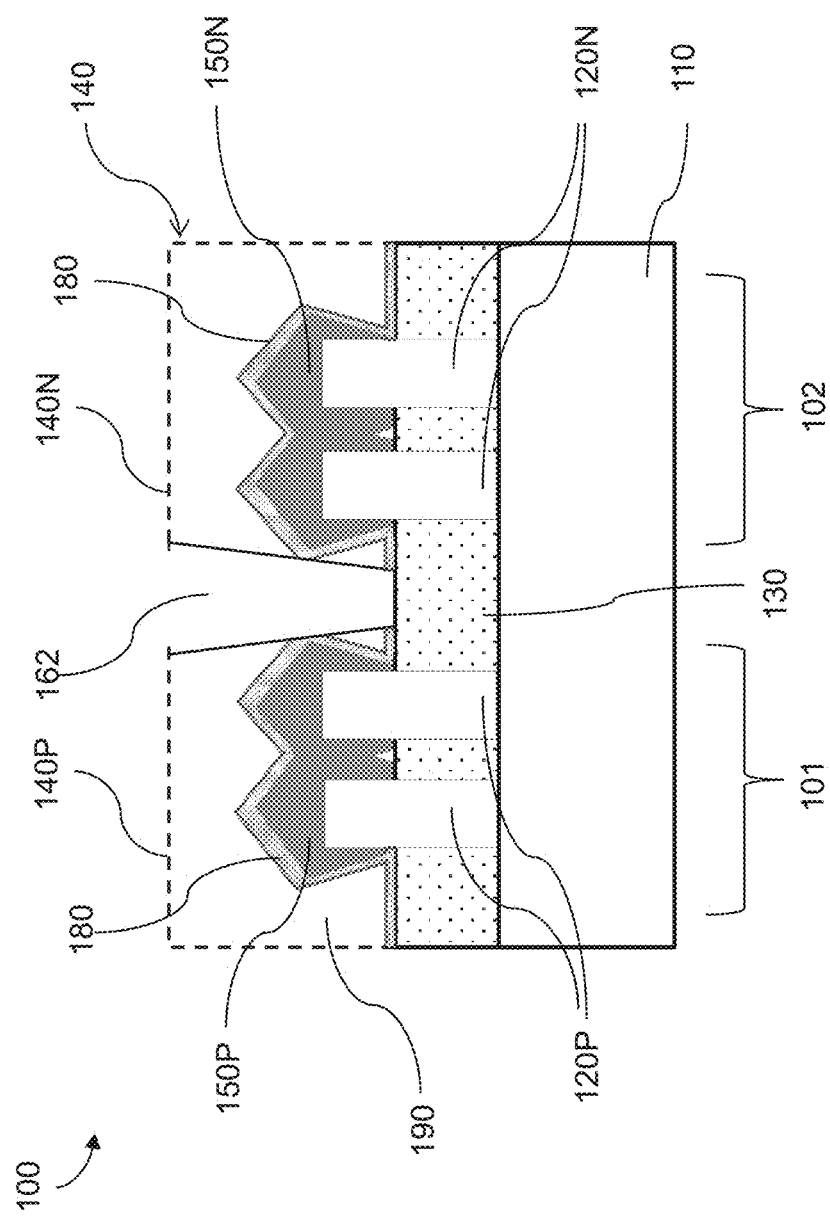

Reference is made to operation 214 of the method 200 (FIG. 3B) and FIG. 11, the dummy gate structure 140 is anisotropically etched to form a trench 162 that separate a portion of the dummy gate structure 140 in the first device region 101 and another portion of the dummy gate structure 140 in the second device region 102. The anisotropic etching in operation 214 is sometimes referred to as a "gate cut." In some embodiments, the operation 214 is performed using an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $SiCl_4$, $CCl_4$, and/or $BCl_3$), a bromine-containing gas (e.g., HBr and/or $CHBR_3$), an iodine-containing gas, other suitable gases and/or plasmas, and/or combinations thereof as the etchant. While the anisotropic etching in operation 214 is effective to etch away polysilicon in the dummy gate structure 140, the etching is substantially retarded by the CESL 180 doped with a p-type dopant, such as boron or gallium. That is, even if the gate cut trench 162 overlaps with the epitaxial features 150P and 150N, the epitaxial features 150P and 150N remain substantially intact due to the etching retardation provided by the p-doped CESL 180. Because of the etching selectivity between polysilicon in the dummy gate structure 140 and the p-doped CESL 180, the operation 214 can be referred to as a self-aligned gate cut process that enjoys a larger process window as compared to gate cut processes involving undoped CESL 180.

Figure 12:
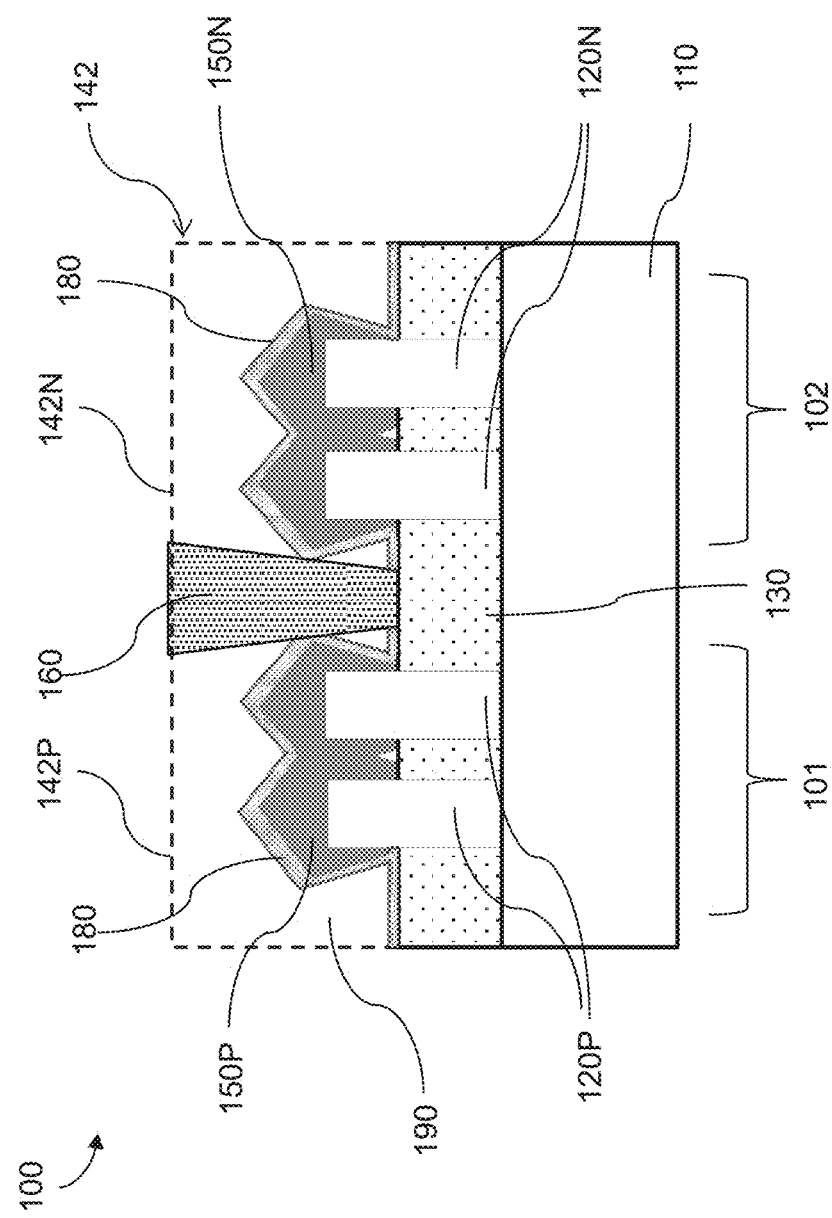

Referring now to operation 216 of the method 200 (FIG. 3B) and FIG. 12, a dielectric material is filled in the trench 162 to form the gate isolation feature 160. The gate isolation feature 160 separates the dummy gate structure 140 into a dummy gate segment 140P in the first device region 101 and a separate dummy gate segment 140N in the second device region 102. The dielectric material in the gate isolation feature 160 can be silicon nitride or other suitable insulative materials. Because the trench 162 can be as narrow as tens of nanometers, a deposition method with better trench-filling ability can be used for the operation 216. In some instances, the dielectric material used to fill the trench 162 is deposited using atomic layer deposition (ALD) or plasma-enhanced atomic layer deposition (PE-ALD).

Referring now to operation 218 of the method 200 (FIG. 3B) and FIG. 12, the dummy gate structure 140 is replaced with the gate stack 142. That is, at the operation 218, the dummy gate segments 140P and 140N are replaced with gate segments 142P and 142N. Essentially, at the operation 218, the dummy gate segments 140P and 140N are removed and the gate segment 142P and 142N are formed in place of the dummy gate segments 140P and 140N. The gate stack 142 (e.g. gate segments 142P and 120N) at least includes a gate dielectric layer interfacing the fins 120P/N and a metal layer over the gate dielectric layer. The gate dielectric layer can be formed of high-K dielectrics such as hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN (Pb-$Mg_xNb_{1-x}O_3$), PZT ($PbZr_xTi_{1-x}O_3$), PZN ($PbZn_xNb_{1-x}O_3$), and PST ($PbSc_xTa_{1-x}O_3$), lead lanthanum titanate, strontium bismuth tantalate, bismuth titanate and barium zirconium titanate. The gate stack 142 may include one or more work function metal layers formed of, for example, TiN, TaN, TaCN, TiCN, TiC, Mo, and W.

Figure 13:
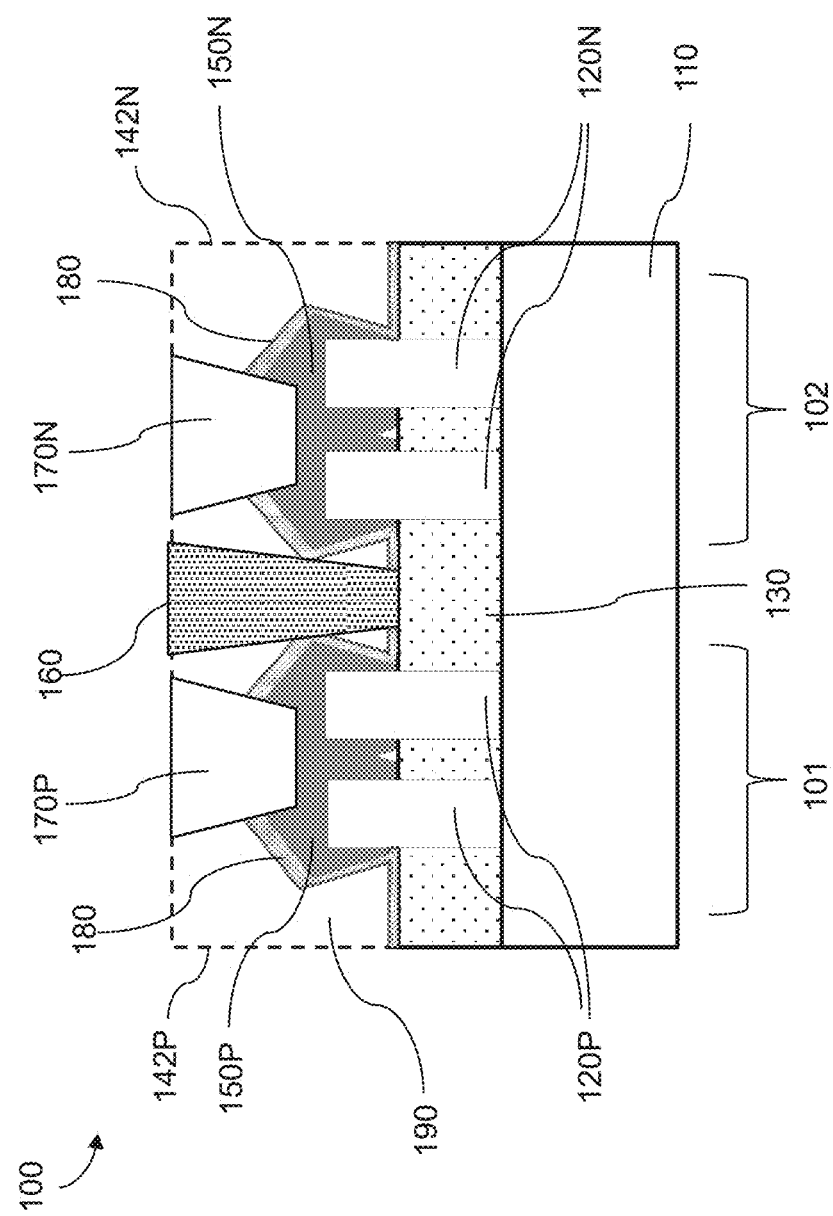
Figure 14:
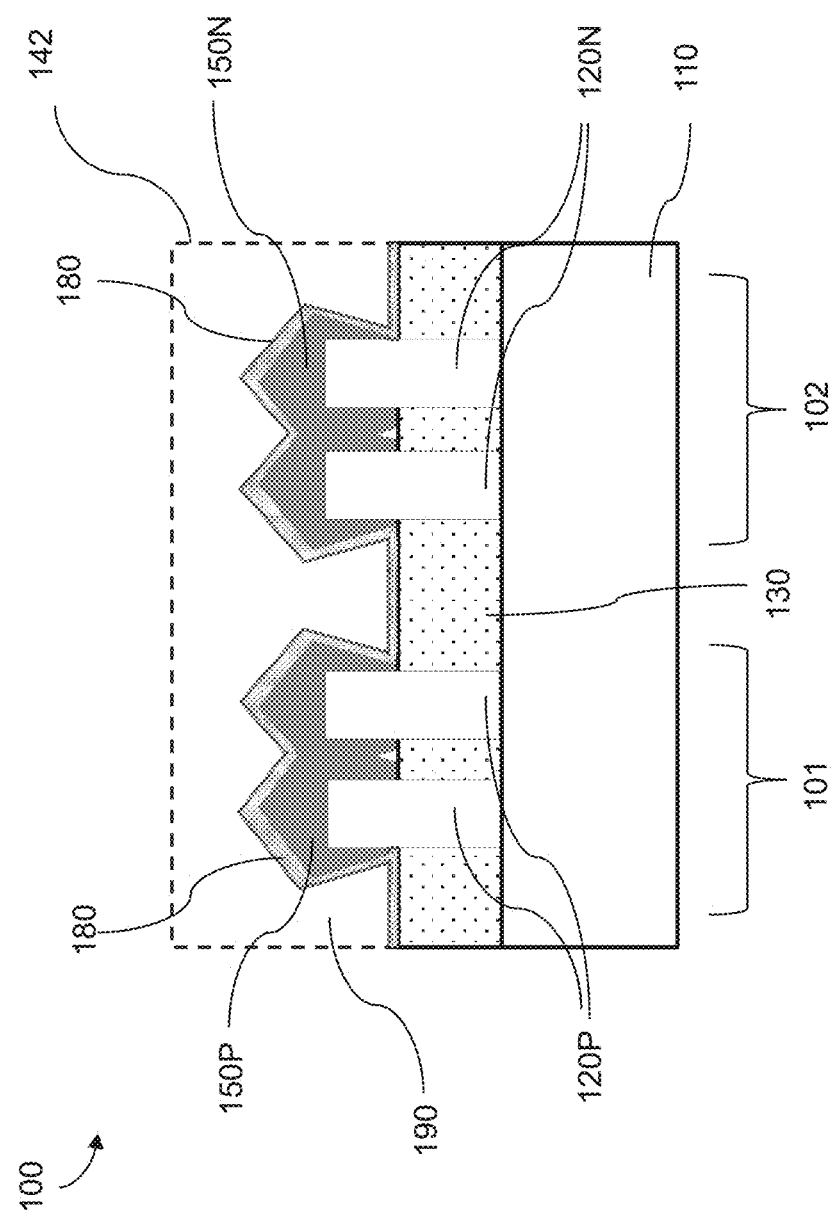

Referring now to operation 220 of the method 200 (FIG. 3B) and FIG. 13, an S/D contact 170P is formed over the epitaxial feature 150P and an S/D contact 170N is formed over the epitaxial feature 150N. To form the source/drain contacts 170P and 170N, a high bias anisotropic etching process is used to etch through the ILD 190 and the dielectric layer or CESL 180 to form an opening that exposes the epitaxial features 150P and 150N. In some instances, the etchant used to form the S/D contact opening includes an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $SiCl_4$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments, an inert gas, such as argon (Ar) and helium (He) is used to accelerate the etching process. In some implementations, to reduce contact resistance and enlarge the S/D contact formation process window, the epitaxial features 150P and 150N can be purposely recessed and a portion of the source/drain features 150P/N to form an opening. Reference is now made to FIG. 2. As shown there, the S/D contact 170P and 170N not only goes through the ILD 190 and the CESL 180 but also extends into the epitaxial features 150P and 150N. It is noted that due to the presence of the ILD 190, the gate stack 142 is shown in dotted lines. Then, the opening is filled with conductive material. In some instances, before conductive material is filled in the opening, silicide may be formed in the opening to reduce contact resistance. Silicide can be formed by reacting silicon with a metal, such as titanium, tantalum, nickel or cobalt. In some examples, the silicide may be formed by a salicide process. The salicide process includes depositing one of the aforementioned metals, annealing to cause the reaction between the metal and silicon, and removing unreacted metal materials. To prevent diffusion of impurity into the conductive material, a barrier layer may be formed on the sidewall of the opening. The barrier layer may be formed of a single layer of titanium nitride (TiN) or tantalum nitride (TaN) or a multilayer such as Ti/TiN, Ta/TaN layers. In some instances, the conductive material is filled in the opening after both silicide and barrier layers are formed. Suitable conductive materials include tungsten (W), copper (Cu), aluminum (Al), and cobalt (Co).

Reference is made to FIG. 3B, at operation 222 of the method 200, the semiconductor device 100 may continue to undergo further processing to form various features and regions known in the art. For example, subsequent processing may form various contacts/vias/lines and multilayers interconnect features (e.g., metal layers and interlayer dielectrics) on the substrate 110, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Reference is now made to FIG. 4, which illustrate a method 300 for fabricating the semiconductor device 100. The method 300 includes operations 302, 304, 306, 308, 310, and 312. Operations in the method 300 are described in further details with references to FIGS. 5-10 and 13-16, which show cross-sectional views along section A-A'. Instead of performing a gate cut process to the dummy gate structure 140 as in the method 200, the gate cut process in the method 300 is performed to the gate stack 142 after it replaces the dummy gate structure 140.

Figure 10:
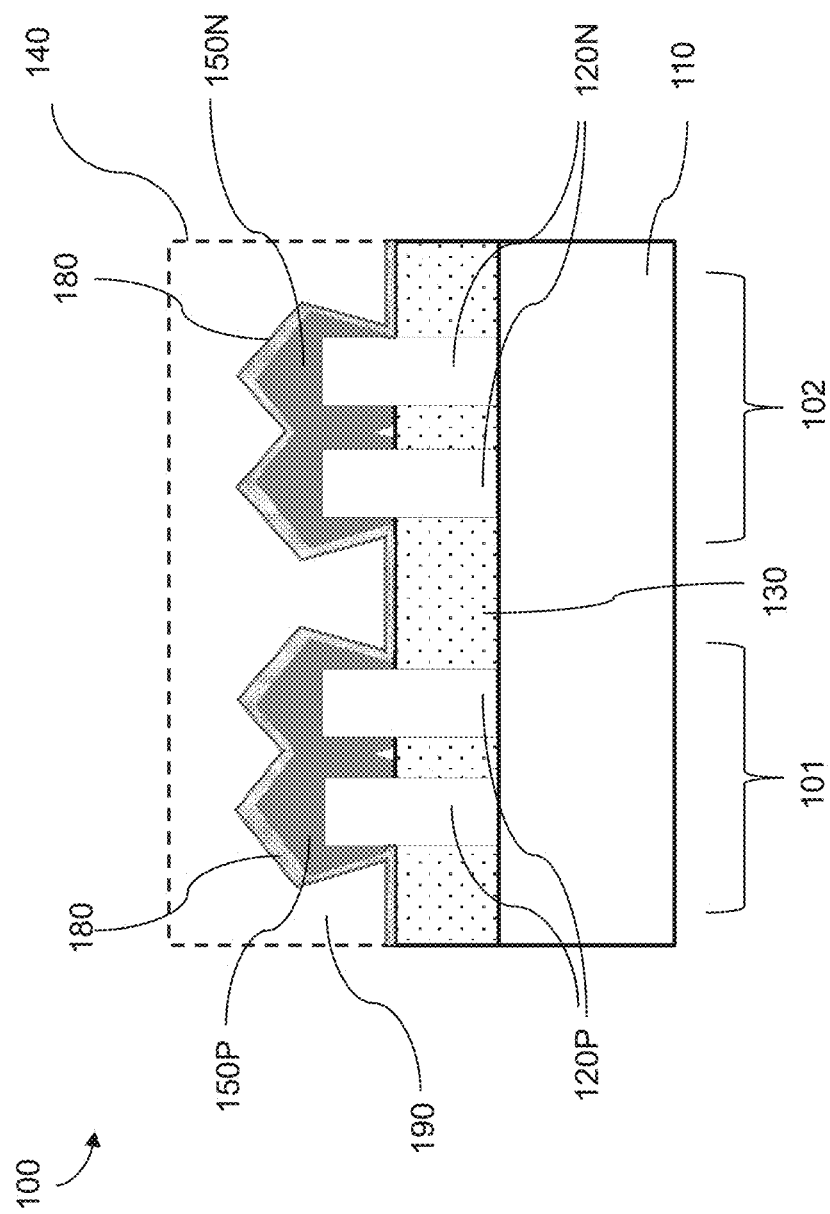

Referring now to operation 302 of the method 300 (FIG. 4) and FIGS. 5-10, the operations 202, 204, 206, 208, 210, and 212 of the method 200 are repeated. Upon conclusion of the operation 302, the semiconductor device 100 (or its intermediate structures) is shown in FIG. 10. Also, at the conclusion of the operation 302, the dummy gate structure 140 has not been replaced with the gate stack 142. Referring now to operation 304 of the method 300 (FIG. 4) and FIG. 14, the dummy gate structure 140 is replaced with the gate stack 142. As the ILD 190 blocks the direct view of the gate stack 142, the gate stack 142 is shown in dotted lines for illustration purposes.

Figure 15:
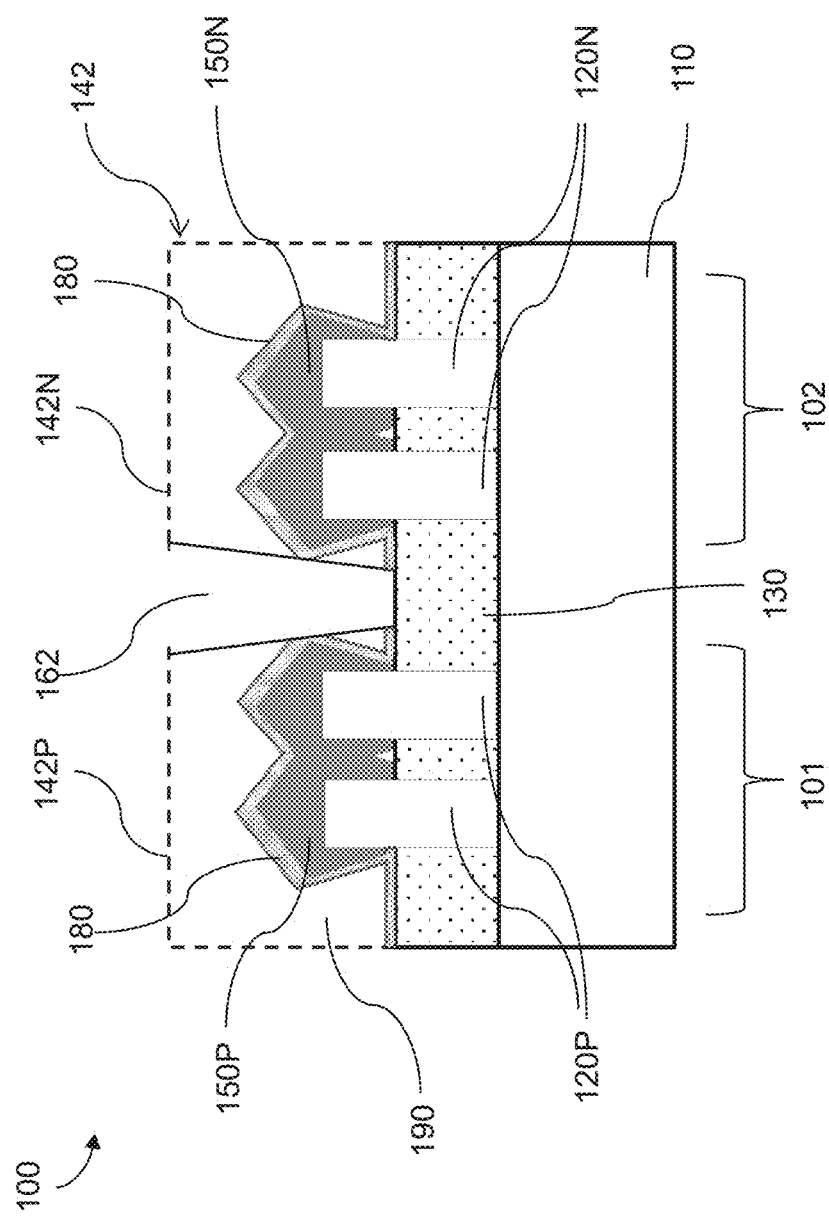

Reference is now made to operation 306 of the method 300 (FIG. 4) and FIG. 15, the gate stack 142 is anisotropically etched to form the trench 162, which separate the gate stack 142 into the gate segment 142P in the first device region 101 and the gate segment 142N in the second device region 102. The anisotropic etching in operation 306 is sometimes referred to as a "gate cut" or "metal gate cut." In some embodiments, the operation 306 is performed using an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $SiCl_4$, $CCl_4$, and/or $BCl_3$), a bromine-containing gas (e.g., HBr and/or $CHBR_3$), an iodine-containing gas, other suitable gases and/or plasmas, and/or combinations thereof as the etchant. While the anisotropic etching in operation 306 is effective to etch away the materials in the gate stack 142, the etching is substantially retarded by the CESL 180 doped with a p-type dopant, such as boron or gallium. That is, even if the gate cut trench 162 overlaps with the epitaxial features 150P and 150N, the epitaxial features 150P and 150N remain substantially intact due to the etching retardation provided by the p-doped CESL 180. Because of the etching selectivity between the materials in the gate stack 142 and the p-doped CESL 180, the operation 306 can be referred to as a self-aligned gate cut process that enjoys a larger process window as compared to gate cut (metal gate cut) processes involving undoped CESL 180.

Figure 16:
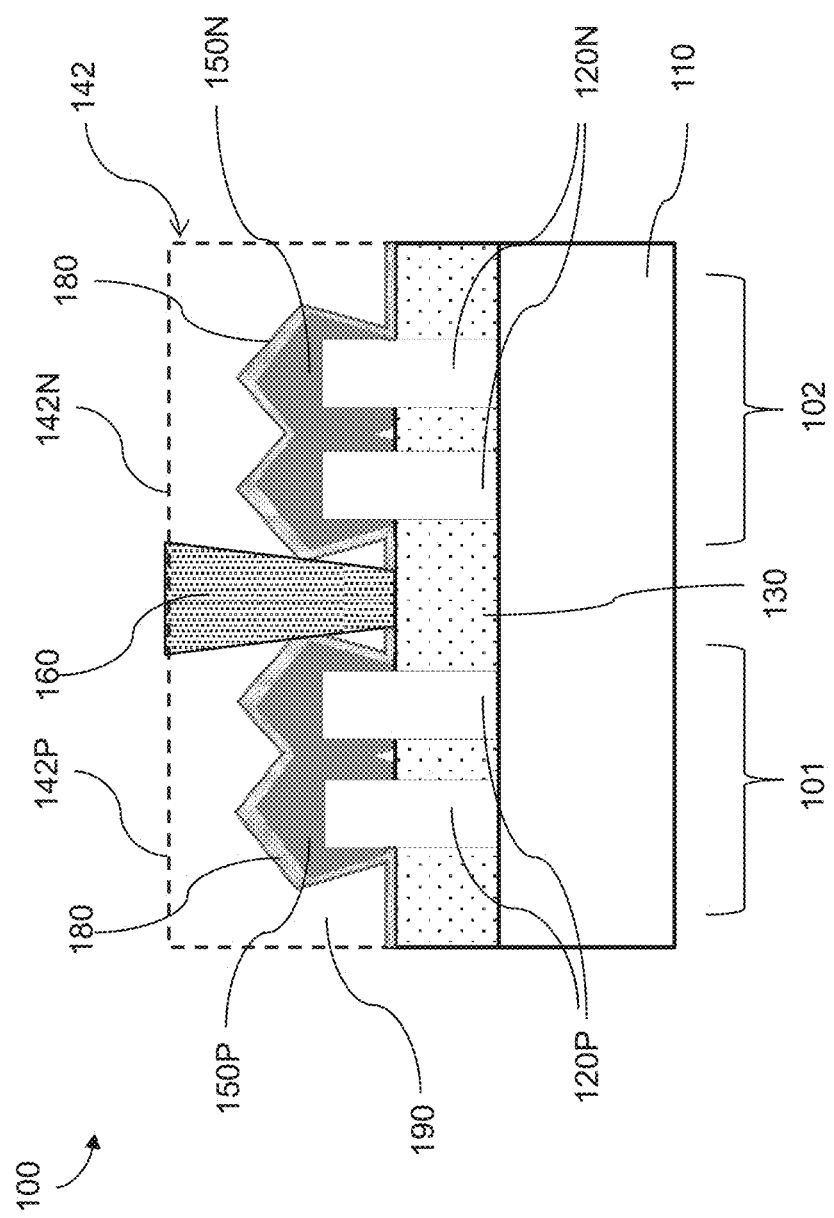

Referring now to operation 308 of the method 300 (FIG. 4) and FIG. 16, the trench 162 is filled with a dielectric materials. The operation 308 is substantially similar to the operation 216 of the method 200, except that the trench 162 in the method 300 is formed in the gate stack 142, as opposed to the dummy gate structure 140 in the method 200. Similarly, operations 310 and 312 are substantially similar to operations 220 and 222 in the method 200. In operation 310, the S/D contact 170P is formed over the epitaxial feature 150P and an S/D contact 170N is formed over the epitaxial feature 150N. In operation 312, the semiconductor device 100 may continue to undergo further processing to form various features and regions known in the art.

Thus, the present disclosure provides a semiconductor device and a method of fabricating the same. In one embodiment, a semiconductor device according to the present disclosure includes a substrate having a first device region and a second device region, a first fin over the substrate in the first device region, a second fin over the substrate in the second device region, a first epitaxial feature over the first fin in a source/drain region of the first fin, a second epitaxial feature over the second fin in a source/drain region of the second fin, and a dielectric layer on the first and second epitaxial features. The first epitaxial feature is doped with a first dopant of a first conductivity and the second epitaxial feature is doped with a second dopant of a second conductivity different from the first conductivity. The dielectric layer is doped with the first dopant. In some embodiment, the first device region is a p-type field effect transistor (pFET) region and the second device region is a n-type FET (nFET) region. In some embodiments, the first conductivity is p-type conductivity and the second conductivity is n-type conductivity. In some implementations, the dielectric layer includes silicon nitride. In some implementations, the dielectric layer has a thickness of 2 to 10 nm. In some embodiments, the first dopant is boron. In some embodiments, the second dopant is phosphorous. In some instances, the first epitaxial feature includes silicon germanium (SiGe). In some embodiments, the second epitaxial feature includes silicon (Si).

In another embodiment, a semiconductor device according to the present disclosure includes a substrate that includes an n-type field effect transistor (nFET) on the substrate. The nFET includes a first fin on the substrate, a second fin on the substrate, a first gate disposed over a channel region of the first fin and a channel region of the second fin, a first epitaxial feature disposed over and extending between a source/drain region of the first fin and a source/drain region of the second fin, and a doped dielectric layer disposed directly on the first epitaxial feature. The first epitaxial feature is doped with an n-type dopant and the doped dielectric layer is doped with boron (B). In some embodiments, the doped dielectric layer includes silicon nitride. In some embodiments, the first epitaxial feature comprises silicon (Si) and phosphorous (P). In some embodiments, the semiconductor device further includes a p-type FET (pFET) on the substrate. The pFET includes a third fin on the substrate, a fourth fin on the substrate, a second gate disposed over a channel region of the third fin and a channel region of the fourth fin, a second epitaxial feature disposed over and extending between a source/drain region of the third fin and a source/drain region of the fourth fin, and the doped dielectric layer disposed directly on the second epitaxial feature. The second epitaxial feature is doped with boron and the doped dielectric layer is doped with B. In some embodiments, the second epitaxial feature includes silicon germanium (SiGe). In some embodiments, the nFET is immediately adjacent to the pFET.

In addition, the present disclosure provides a method of fabricating a semiconductor device. The method includes providing a substrate having a first device region and a second device region; forming a first fin in the first device region and a second fin in a second device region, each of the first and second fins having a channel region and a source/drain region; forming a dummy gate structure over the channel region of the first fin and the channel region of the second fin; forming a first epitaxial feature over the source/drain region of the first fin and a second epitaxial feature over the source/drain region of the second fin; forming a doped dielectric layer over the first and second epitaxial features; and anisotropically etching the dummy gate structure to separate a portion of the dummy gate structure in the first device region and another portion of the dummy gate structure in the second device region. The first epitaxial feature includes a first dopant of a first conductivity and the second epitaxial feature includes a second dopant of a second conductivity different from the first conductivity. The doped dielectric layer includes the first dopant. In some embodiments, the first device region is a p-type field effect transistor (pFET) region and the second device region is an n-type FET (nFET) region. In some embodiments, the forming of the doped dielectric layer over the first and second epitaxial features includes depositing an epitaxial layer over the first and second epitaxial features while in situ doping the epitaxial layer with the first dopant. In some embodiments, the forming of the doped dielectric layer over the first and second epitaxial features includes depositing an epitaxial layer over the source/drain regions of the first and second fins, and implanting the epitaxial layer with the first dopant. In some embodiments, the first dopant is boron (B) and the second dopant is an n-type dopant.

While the present disclosure has been described by way of example and in terms of the preferred embodiments, it is to be understood that the present disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A device comprising:
a first fin structure and a second fin structure disposed over a substrate;
a gate structure including a first portion disposed over the first fin structure and a second portion disposed over the second fin structure;
an interlayer dielectric layer disposed over the gate structure;
a gate dielectric isolation feature extending through the interlayer dielectric layer and interfacing with a sidewall surface of the first portion of the gate structure and with a sidewall surface of the second portion of the gate structure to thereby electrically isolate the first portion of the gate structure from the second portion of the gate structure;
a first source/drain feature disposed on the first fin structure; and
a doped dielectric layer disposed on the first source/drain feature.

2. The device of claim 1, wherein the doped dielectric layer interfaces with the first source/drain feature, and
wherein the gate dielectric isolation feature extends to the doped dielectric layer interfacing with the source/drain feature.

3. The device of claim 2, wherein the doped dielectric layer includes a p-type dopant.

4. The device of claim 1, further comprising a second source/drain feature disposed on the second fin structure; and
the doped dielectric layer disposed on the second source/drain feature, and
wherein the first source/drain feature is doped with a first dopant of a first conductivity, the second source/drain feature is doped with a second dopant of a second conductivity that is opposite the first conductivity and the doped dielectric layer is doped with a third dopant of the first conductivity.

5. The device of claim 4, wherein the first conductivity is p-type conductivity and the second conductivity is n-type conductivity.

6. The device of claim 1, further comprising a shallow trench isolation structure disposed in the substrate and extending form the first fin structure to the second fin structure.

7. The device of claim 6, wherein the gate dielectric isolation feature extends to the shallow trench isolation structure such that the gate dielectric isolation feature interfaces with the shallow trench isolation structure.

8. A device comprising:
a dielectric isolation structure disposed on a substrate;
a first semiconductor fin extending through dielectric isolation structure;
a first source/drain feature disposed on the first semiconductor fin; and
a doped dielectric layer disposed directly on the first source/drain feature and the dielectric isolation structure, the doped dielectric layer having a top surface including a first portion disposed above the first semiconductor fin and a second portion that is at a height lower than a top surface of the first semiconductor fin.

9. The device of claim 8, wherein the doped dielectric layer is conformally disposed directly on the first source/drain feature.

10. The device of claim 8, further comprising:
a second semiconductor fin extending through dielectric isolation structure; and
a second source/drain feature disposed on the second semiconductor fin, wherein the first source/drain feature is doped with a first dopant of a first conductivity, the second source/drain feature is doped with a second dopant of a second conductivity that is opposite the first conductivity and the doped dielectric layer is doped with a third dopant of the first conductivity.

11. The device of claim 8, further comprising:
a second semiconductor fin extending through dielectric isolation structure;
a gate structure including a first portion disposed over the first semiconductor fin and a second portion disposed over the second semiconductor fin;
an interlayer dielectric layer disposed over the gate structure; and
a gate dielectric isolation feature extending through the interlayer dielectric layer and interfacing with a sidewall surface of the first portion of the gate structure and with a sidewall surface of the second portion of the gate structure to thereby electrically isolate the first portion of the gate structure from the second portion of the gate structure.

12. The device of claim 11, wherein the first portion of the gate structure is part of a first transistor having a first conductivity and wherein the second portion of the gate structure is part of a second transistor having a second conductivity that is opposite the first conductivity.

13. The device of claim 8, wherein the doped dielectric layer is doped with boron (B).

14. The device of claim 8, wherein the first source/drain feature includes a first dopant having a first conductivity and the doped dielectric layer includes a second dopant having a second conductivity that is opposite the first conductivity.

15. A device comprising:
a first fin structure disposed over a substrate;
a second fin structure disposed over the substrate;
a first source/drain feature formed of a first semiconductor material is disposed on the first fin structure;
a second source/drain feature formed of a second semiconductor material is disposed on the second fin structure, the second semiconductor material being different than the first semiconductor material;
a doped dielectric layer disposed directly on the first and second source/drain features;
an interlayer dielectric layer disposed over the first and second source/drain features; and
a gate dielectric isolation feature extending through the interlayer dielectric layer and between the first and second source/drain features, the gate dielectric isolation feature interfacing with the doped dielectric layer disposed directly on the first and second source/drain features.

16. The device of claim 15, wherein the doped dielectric layer includes a top surface that extends to a height that is less than a top surface of the gate dielectric isolation feature.

17. The device of claim 15, wherein the first semiconductor material includes SiGe and the second semiconductor material includes Si,
wherein the first semiconductor material is doped with boron and the second semiconductor material is doped with a first dopant selected from the group consisting of phosphorous and arsenic, and
wherein the doped dielectric layer is doped with a second dopant selected from the group consisting of boron and gallium.

18. The device of claim 15, further comprising a gate structure including a first portion disposed over the first fin structure and a second portion disposed over the second fin structure, and
wherein the gate dielectric isolation feature extends through the gate structure and interfaces with a sidewall surface of the first portion of the gate structure and with a sidewall surface of the second portion of the gate structure to thereby electrically isolate the first portion of the gate structure from the second portion of the gate structure.

19. The device of claim 15, wherein the first source/drain feature includes a dopant and the doped dielectric layer includes the dopant, and wherein the second source/drain feature is free of the dopant.

20. The device of claim 15, further comprising a shallow trench isolation structure disposed in the substrate extending from the first fin structure to the second fin structure,
   wherein the gate dielectric isolation feature interfaced with the shallow trench isolation structure, and
   wherein the doped dielectric layer interfaces with the shallow trench isolation structure.

\* \* \* \* \*